United States Patent [19]

Takenouchi et al.

[11] Patent Number: 4,990,319

[45] Date of Patent: Feb. 5, 1991

[54] PROCESS FOR PRODUCING AMMONIA AND SULFUR DIOXIDE

[75] Inventors: Youji Takenouchi; Katsuhiko Nishiguchi, both of Okayama; Kunio Abe, Kurashiki, all of Japan

[73] Assignees: Kuraray Co., Ltd., Okayama; Kyowa Gas Chemical Industry Co., Ltd.; JGC Corporation, both of Tokyo, all of Japan

[21] Appl. No.: 322,205

[22] Filed: Mar. 13, 1989

Related U.S. Application Data

[63] Continuation-in-part of Ser. No. 245,689, Sep. 15, 1988, abandoned.

[30] Foreign Application Priority Data

Sep. 15, 1987 [JP] Japan .................. 62-230480

[51] Int. Cl.⁵ .................. C01B 17/50; C01C 1/00
[52] U.S. Cl. .................. 423/352; 423/541 R; 423/544; 423/554; 423/555; 423/638
[58] Field of Search .................. 423/352, 638, 541 A, 423/544, 554, 541 R, 555

[56] References Cited

U.S. PATENT DOCUMENTS

| | | | |
|---|---|---|---|
| 932,130 | 8/1909 | Hunter | 423/554 |
| 1,348,933 | 8/1920 | Dolbear | 423/638 |
| 2,222,740 | 11/1940 | Bornemann et al. | 423/541 |
| 2,230,592 | 2/1941 | Griessbach et al. | 423/541 |
| 2,232,099 | 2/1941 | de Jan | 423/541 |
| 3,087,790 | 4/1963 | Wheelock et al. | 423/541 |
| 3,758,668 | 9/1973 | Lapple et al. | 423/638 |
| 4,225,573 | 9/1980 | Kobayashi | 423/638 |

FOREIGN PATENT DOCUMENTS

| | | | |
|---|---|---|---|
| 136494 | 7/1979 | Fed. Rep. of Germany | 423/544 |
| 37-8251 | 7/1962 | Japan . | |
| 47-30599 | 8/1972 | Japan . | |
| 20093 | 9/1972 | Japan | 423/554 |
| 50-101294 | 4/1975 | Japan . | |
| 53-125300 | 6/1978 | Japan . | |
| 56-73619 | 1/1981 | Japan . | |
| 514538 | 11/1939 | United Kingdom | 423/544 |

OTHER PUBLICATIONS

Bessatsu Kagaku Kogyo (Chemical Industry, Separate Volume), vol. 15, No. 2, pp. 119-128 (1971).

*Primary Examiner*—Wayne A. Langel
*Attorney, Agent, or Firm*—Wenderoth, Lind & Ponack

[57] ABSTRACT

A process for producing $NH_3$ and $SO_2$ from ammonium sulfate, which comprises (i) reacting ammonium sulfate with a metal oxide or hydroxide at a temperature of not more than 200° C. to form $NH_3$, water and a metal sulfate and recovering $NH_3$, (ii) decomposing the metal sulfate in the presence of a reducing agent to form a metal oxide and $SO_2$ and recovering $SO_2$, and (iii) recycling the metal oxide to step (i) as such or after it is converted to a metal hydroxide.

10 Claims, 1 Drawing Sheet

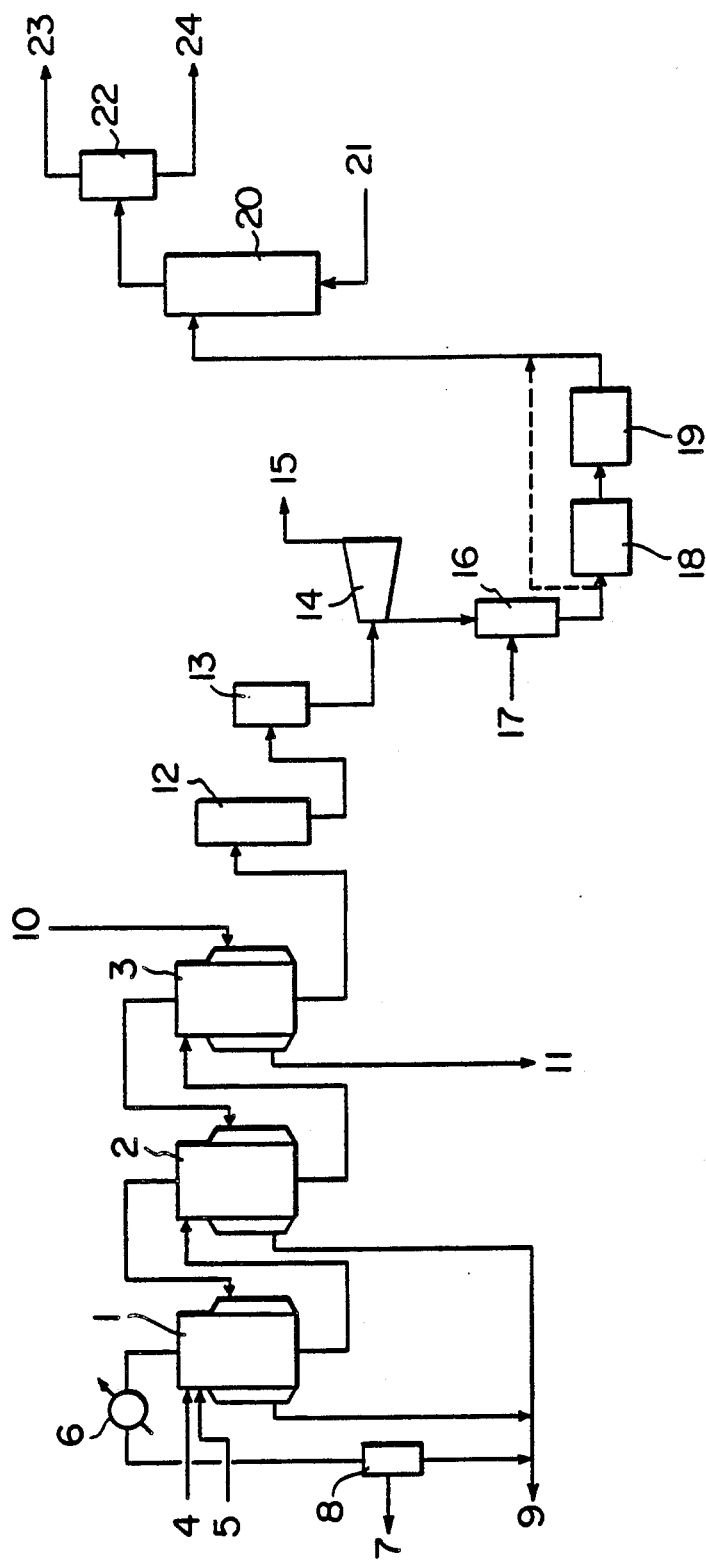

PROCESS FOR PRODUCING AMMONIA AND SULFUR DIOXIDE

This application is a continuation-in-part of application Ser. No. 245,689, filed Sept. 15, 1988, now abandoned.

This invention relates to a process for producing ammonia ($NH_3$) and sulfur dioxide (($SO_2$) from ammonium sulfate. More specifically, it relates to a process for producing $NH_3$ $SO_2$ and which comprises decomposing ammonium sulfate at a temperature of not more than 200° C. to $NH_3$ and a metal sulfate and decomposing the metal sulfate in the presence of a reducing agent to form a metal oxide and $SO_2$.

A great quantity of ammonium sulfate is formed in various industries, for example the chemical industry involving treatment of an ammoxidation product of organic matter with sulfuric acid (such as the production of epsilon-caprolactam, methyl methacrylate by the acetone cyanohydrin method, and acrylonitrile by the ethylene cyanohydrin method), an industry in which a liquor resulting from ammonia neutralization of a desulfurization waste liquor formed by treatment of a crude oil with sulfuric acid is discharged, and an industry in which desulfurization of exhaust gases is carried out by using aqueous ammonia. This ammonium sulfate is used mainly as a fertilizer. Since, however, the supply of ammonium sulfate is excessive for its demand, its price decreases to cause a marked economic disadvantage. Furthermore, a very great amount of ammonia is required for neutralizing sulfuric acid remaining in the waste liquor, and this becomes a great burden. Furthermore, since ammonium sulfate contains impurities, much work is needed for purifying it to a form suitable for use. Thus, in the industries where ammonium sulfate occurs, it is an important problem to recover it as an economically feasible form. If, therefore, ammonium sulfate can be recovered efficiently as $NH_3$ and sulfuric acid by decomposition, it would become a promising solution to the above problem.

Many methods have been known for decomposing ammonium sulfate and recovering it as $NH_3$ and $SO_2$ (or sulfuric acid). For example, "Bessatsu Kagaku Kogyo" (Chemical Industry, Separate Volume), vol. 15, No. 2 (1971), pages 119 to 128 discloses a method which comprises causing magnesium oxide (MgO) to absorb $SO_2$ contained in a waste gas thereby to form magnesium sulfite, converting magnesium sulfite into magnesium sulfate using manganese oxide, etc. as a catalyst, decomposing it into MgO and $SO_2$ at more than 750° C. using carbon, and recovering $SO_2$.

Japanese Patent Publication No. 8251/1962 describes a process for producing $NH_3$ and $SO_2$ which comprises reacting ammonium sulfate with zinc oxide at a temperature of about 300° to 500° C. to generate $Nh_3$ and form zinc sulfate, and then reacting the residue from this first reaction with a coke at a temperature of at least 600° C. to form $SO_2$.

Japanese Laid-Open Patent Publication No. 30599/1972 describes a process for obtaining $SO_2$ by thermally decomposing ammonium sulfate at 300° to 500° C. and then burning and decomposing the decomposition product at 850° to 1250° C.

Japanese Laid-Open Patent Publication No. 73619/1981 discloses a process for producing an aqueous solution of highly pure ammonium sulfite and acid ammonium sulfite which comprises thermally decomposing ammonium sulfate at a temperature of at least 250° C. to form $NH_3$ and a composition containing acid ammonium sulfite, thermally decomposing the composition at a temperature of 250° to 440° C. to form a decomposition gas composed of $SO_2$ and $NH_3$, purifying the decomposition gas, causing the purified decomposition gas to be absorbed by water or an aqueous ammonia solution to form an aqueous solution of ammonium sulfite and acid ammonium sulfite.

Japanese Laid-Open Patent Publication No. 101294/1975 discloses a process for obtaining a gaseous mixture of $NH_3$ and $SO_2$ which comprises reacting ammonium sulfate with carbon at 480° to 630° C.

Japanese Laid-Open Patent Publication No. 25300/1978 discloses a process for treating ammonium sulfate, which comprises adding a solid form or slurry of magnesium oxide or magnesium hydroxide to an aqueous solution of ammonium sulfate, almost completing the reaction of the mixture by elevating the reaction temperature to form ammonia and magnesium sulfate, then concentrating the aqueous magnesium sulfate solution to separate and recover $MgSO_4 \cdot nH_2O$ (n=1, 2, 3, 4, 6, or 7), and feeding $MgSO_4 \cdot nH_2O$ into a heat decomposition furnace to form sulfur dioxide.

In the conventional ammonium sulfate decomposing techniques described above, ammonium sulfate is decomposed at high temperatures, and the reaction is carried out in a high ammonium sulfate conversion. Accordingly, the recovered $NH_3$ or $SO_2$ inevitably contain impurities formed at the time of decomposition. This tendency is particularly pronounced when the starting ammonium sulfate contains organic materials such as diacetonesulfonic acid or its polymer. For use in applications requiring high purity, the recovered $NH_3$ or $SO_2$ must be purified by a complex purifying step. The conventional techniques, therefore, are not economically advantageous.

On the other hand, it is known in the field of desulfurization of exhaust gases to decompose ammonium sulfate at low temperatures. This technique involves reacting ammonium sulfate obtained by exhaust gas desulfurization with calcium hydroxide and recovering gypsum. $NH_3$ is obtained as ammonium hydroxide. The ammonium hydroxide is recycled to the absorbing step for reuse, and does not require so high a purity. This technique does not involve an idea of recovering it as $NH_3$ gas. It may be possible to add slaked lime or quick lime to ammonium sulfate and heat the mixture to volatilize $NH_3$. This method, however, would usually be feasible in pollution control. In the field of pollution control, for example desulfurization of exhaust gases which almost disregards economy, the purpose is to remove $SO_2$. It has no idea of efficiently recovering $NH_3$ and $SO_2$ and re-using them, much less its commercialization. Recovery of $NH_3$ from a liquid containing $SO_2$ absorbed therein might be conceivable from the techniques used in the field of pollution control in which the significance of recovering $NH_3$ from ammonium sulfate quite differs from that in the industry which forms ammonium sulfate. However, an idea of using, in combination, a step of decomposing a metal sulfate and efficiently producing $NH_3$ and $SO_2$ of high purity cannot be easily derived from the techniques used in the field of pollution control.

It is an object of this invention therefore to provide a process for efficiently producing $NH_3$ and $SO_2$ of good purity by decomposing ammonium sulfate under relatively mild operating conditions.

The present inventors made extensive investigations in order to achieve the above object, and have found that $NH_3$ and $SO_2$ of good purity can be efficiently produced by a relatively simple and convenient process which comprises reacting ammonium sulfate occurring in various chemical industries with a metal oxide or hydroxide at a temperature of not more than 200° C. to form $NH_3$ and a metal sulfate and decomposing the metal sulfate in the presence of a reducing agent to form a metal oxide and $SO_2$.

According to this invention, there is provided a process for producing $NH_3$ and $SO_2$ from ammonium sulfate, which comprises (i) reacting ammonium sulfate with a metal oxide or hydroxide at a temperature of not more than 200° C. to form $NH_3$, water and a metal sulfate and recovering $NH_3$, (ii) decomposing the metal sulfate in the presence of a reducing agent to form a metal oxide and $SO_2$ and recovering $SO_2$, and (iii) recycling the metal oxide to step (i) as such or after it is converted to a metal hydroxide.

The term "ammonium sulfate" as a starting material used in this invention denotes not only ammonium sulfate but also acid ammonium sulfate, acid ammonium sulfate containing sulfuric acid, and mixtures of these. These starting materials may include impurities in a concentration of up to 10% by weight. The impurities include, for example, non-combustible carbon, ash, epsilon-caprolactam, acetonedisulfonic acid, p-toluenesulfonic acid, polymers of these and sulfur which are contained in an epsilon-caprolactam waste liquor, a methyl methacrylate waste liquor from the acetone-cyanohydrin method, an acrylonitrile waste liquor from the ethylenecyanohydrin method and in a crude oil refining waste liquor.

In step (i) of the method of this invention, the ammonium sulfate is reacted, usually in a reaction medium such as water, with the metal oxide or hydroxide at a temperature of not more than 200° C., preferably in the range of 60° to 120° C.

Since in the process of this invention, the metal oxide or hydroxide is reused, it may be an oxide or hydroxide of a relatively expensive metal. Generally, however, the use of an oxide or hydroxide of a metal selected from Mg, Ca and Ba is preferred because it produces a good effect and is practicable. The use of magnesium oxide or hydroxide is especially preferred because the reduction temperature used in the decomposition of the resulting metal sulfate in the presence of a reducing agent can be lowered. These metal oxides or hydroxides may be used singly or as a mixture. The metal oxides are preferably used in this invention.

The oxide or hydroxide (A) of a metal selected from Mg, Ca and Ba may be used in combination with at least one oxide or hydroxide (B) of a metal selected from Mn, Cu, Ni and Zn. In this case, the oxide or hydroxide (B) is used preferably in an amount of generally not more than 50 mole % based on the metal oxide or hydroxide (A). A combination of these metal oxides or hydroxides in which the mole ratio of the metal oxide or hydroxide (A) to the metal oxide or hydroxide (B) is generally from 1:0.01 to 1:0.5, particularly from 1:0.1 to 1:0.3, is preferred because it aids in the decomposition of organic compounds contained as impurities and the metal sulfate and makes it possible to lower the decomposition temperature.

This reaction can usually be carried out in aqueous solution, and the pH of the aqueous solution is desirably maintained at about 8 to 13, preferably at 9 to 10, in order to inhibit corrosion of the reactor and increase the ratio of recovery of ammonia. Accordingly, it is generally preferred to adjust the mole ratio of the metal oxide or hydroxide to the sulfate ion to 1-2, preferably 1.03-1.4.

There is no particular restriction on the reactor used in the reaction, and it may be, for example, a stirred tank or a stirred tank equipped with a distillation column. The material of which the reactor is made is not particularly limited, but stainless steel is preferred in view of corrosion resistance.

The ammonium sulfates reacted with the metal oxide or hydroxide to form $NH_3$, water and the metal sulfate. $NH_3$ is recovered by known means such as distillation.

Preferably, from the standpoint of the increase of the ratio of $NH_3$ recovery or energy consumption, the reaction between ammonium sulfate and the metal oxide or hydroxide is carried out in two or more successively aligned reactors, and the reaction in the first-stage reactor is carried out at a reaction temperature of 60° to 100° C., preferably 70° to 90° C. It is more preferred to carry out the reaction of ammonium sulfate with the metal oxide or hydroxide in at least two successively aligned reactors in accordance with a so-called "multiple-effect evaporation method" by which heat is given to a reactor desired to be set at the highest reaction temperature and the vapor generated from it is supplied as a heat source to a reactor to be set at the next highest reaction temperature, and the vapor generated in this reactor is then supplied as a heat source to a reactor to be set at the third highest reaction temperature, and the vapor is successively supplied from one reactor to another in this manner. The first-stage reactor, as referred to herein, denotes a reactor in which the starting ammonium sulfate, a reaction medium such as water and the metal oxide or hydroxide are first put. Heat is given to the reactor to be desired to be set at the highest reaction temperature, by introducing a heat medium such as steam into an inside or an outside tube or a jacket in the reactor.

In carrying out the process of this invention in two or more successively aligned reactors, it is important that the reaction temperature in the first-stage reactor be 60° to 100° C. The reaction temperatures in the second-stage and subsequent reactors may be not more than 200° C.

If, in the process of this invention, the ammonium sulfate is reacted with the metal oxide or hydroxide while maintaining the conversion of ammonium sulfate at 60 to 85 mole %, preferably 65 to 80 mole %, ammonia can be obtained in a high purity. This procedure, therefore, is a preferred embodiment.

When the metal sulfate obtained in the above reaction is a water soluble compound such as $MgSO_4$, impurities insoluble in the reaction medium, such as carbon and sulfur compounds can be removed. The carbon can be reused as a fuel or a reducing agent, and the sulfur compounds can be recovered as $SO_2$. If the metal sulfate is a water-insoluble compound such as $CaSO_4$, a water-soluble impurity such as acetonedisulfonic acid can be removed. The impurity can be concentrated and recovered for use as a reducing agent. In either case, the impurities can be separated, recovered and reused, and the industrial wastes can be drastically decreased.

The resulting metal sulfate is concentrated or crystallized by a difference in solubility, and separated by a solid-liquid separator if it is water soluble. If it is insoluble in water, it can be separated by a solid-liquid separator and recovered as a solid metal sulfate.

If the mother liquor resulting from separating and recovering of the metal sulfate and the unreacted metal oxide or hydroxide from the reaction product obtained by the reaction of ammonia sulfate with the metal oxide or hydroxide is recycled to step (i) in the process of this invention, the ratio of ammonia recovery can be increased. Hence, this is a preferred embodiment.

The reaction product obtained by the reaction of ammonium sulfate with the metal oxide or hydroxide in which the metal is magnesium is usually an aqueous solution or slurry of magnesium sulfate in a concentration of at least 15% by weight. If this aqueous solution or slurry is fed to the next step as such, the energy for dehydration is consumed greatly. This is not industrially desirable. Usually, anhydrous magnesium sulfate and magnesium sulfate monohydrate are obtained by dehydrating magnesium heptahydrate by heating it in an open system, hot air drying, etc. It is well known that the energy consumed for evaporating and removing the water of crystallization is very great.

The present inventors noted that if water can be removed in the form of a liquid, the energy required to obtain 1 kg of magnesium sulfate monohydrate can be decreased by 422.5 kcal/mole in accordance with the following formulae.

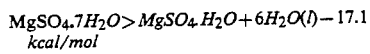

$MgSO_4.7H_2O > MgSO_4.H_2O + 6H_2O(l) - 17.1$ kcal/mol

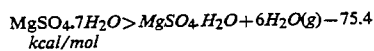

$MgSO_4.7H_2O > MgSO_4.H_2O + 6H_2O(g) - 75.4$ kcal/mol

Further investigations on this basis led to the discovery that if the above aqueous solution or slurry of magnesium sulfate is heated in a closed system to 100° to 200° C., preferably 120° to 170° C. to separate and recover a solid product, water can be removed in the form of a liquid, and a solid product having a water content of 17 to 30% by weight and composed mainly of magnesium sulfate monohydrate can be obtained with a low energy consumption, and that if this solid product is supplied to the next step, the thermal load decreases.

If the above aqueous solution or slurry is heated to a temperature of more than 200° C., the energy for temperature elevation becomes very great, and the effect of the invention undesirably tends to be reduced.

A solid product having a water content of 17 to 30% by weight can be obtained with better efficiency by heating magnesium sulfate heptahydrate or an aqueous solution or slurry of magnesium sulfate in a concentration of at least 15% by weight in a closed system to 100° to 200° C., preferably 120° to 170° C. and maintaining it at 100° to 200° C., preferably 120° to 170° C., for at least 60 minutes to separate and recover the solid product; or by first heating the aqueous solution or slurry to 120° to 170° C. and then quickly lowering the pressure to atmospheric pressure to separate and recover the solid product; or by heating the aqueous solution or slurry to 120° to 170° C., maintaining it at this temperature for at least 60 minutes, and then quickly lowering the pressure to atmospheric pressure to separate and recover the solid product. Separation and recovery of the solid after heating may be effected under pressure, but it is practicable from the viewpoint of operability to separate and recover the solid product after the pressure is returned to atmospheric pressure.

The term "quickly" as used above refers to the time within which magnesium sulfate monohydrate is not converted back to magnesium sulfate heptahydrate. Usually, it means 5 minutes or less. It is preferred to add an excess of magnesium sulfate monohydrate or magnesium sulfate anhydride salt at a time when the aqueous solution or slurry containing magnesium sulfate in a concentration of at least 15% by weight is heated to 100° to 200° C., preferably 120° to 170° C., or when it is maintained at this temperature for at least 60 minutes, and when the pressure is lowered to atmospheric pressure, because a sold product having a water content of 17 to 30% by weight can be obtained with better efficiency. The time during which the above solution or slurry is maintained at 100° to 200° C., preferably 120° to 170° C., may be at least 60 minutes. Usually, it is practical to perform this operation for 1 to 3 hours. When a solid of magnesium sulfate heptahydrate is to be heated, the above method can be applied because if it is heated to 100° to 200° C., liquid water exists in it.

When water is not used in the previous step, the resulting metal sulfate is directly fed to the next step. This metal sulfate may permissibly contain organic matter.

The metal sulfate is then decomposed in the presence of a reducing agent to form a metal oxide and $SO_2$. Examples of the reducing agent include carbon such as coal, activated carbon, coke, petroleum coke, graphite and carbon black, carbon monoxide, hydrogen, fuel decomposition gases, and an oxo gas obtained by decomposition of, for example, methanol.

In the present invention, the metal sulfate is decomposed in the presence of a reducing agent in step (ii) to form a metal oxide and sulfur dioxide. The specification of the above-cited Japanese Laid-Open Patent Publication No. 125300/1978 describes a process in which $MgSO_4.nH_2O$ is fed into a heat decomposition furnace. Investigations of the present inventors have shown that even at the same reaction temperature, the decomposition reaction of $MgSO_4.nH_2O$ in the presence of a reducing agent can give a higher decomposition rate. For example, when the thermal decomposition was performed by the method disclosed in Japanese Laid-Open Patent Publication No. 125300/1978 at a reaction temperature of 800°, 900° and 1000° C., the decomposition rate of $MgSO_4$ anhydrous salt was less than about 2 mole %, about 3 mole % and about 6 mole % respectively according to the reaction temperature. In contrast, when the $MgSO_4$ anhydrous salt was decomposed in the presence of carbon as the reducing agent, the decomposition rate was 30 mole %, 88 mole % and about 100 mole %, respectively. Thus, in the presence of the reducing agent, the decomposition reaction of the metal sulfate can be efficiently carried out.

The reactions involved in the reduction of the metal sulfate can be shown by the following three reaction equations in which M represents a metal.

$MSO_4 + H_2 > MO + SO_2 + H_2O$ (1)

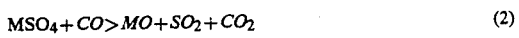

$MSO_4 + CO > MO + SO_2 + CO_2$ (2)

$MSO_4 + \frac{1}{2}C > MO + SO_2 + \frac{1}{2}CO_2$ (3)

Those skilled in the art would easily think that to decrease the amount of gases formed by the reaction, it is advantageous to carry out the decomposition of the metal sulfate in accordance with the reaction equation (3). However, the reaction in accordance with equation (3) is a solid-solid reaction, and investigations of the present inventors have shown that its reducing efficiency is not entirely satisfactory.

In order to achieve the above object of this invention, the present inventors paid their attention to equation (3), the extensively worked for a method of decomposing the metal sulfate by a solid-solid reaction with a high reducing efficiency. As a result, they have found that when the metal sulfate is submitted to decomposition reaction as a mixture with carbon, the decomposition reaction can be performed with a high reducing efficiency.

Examples of the carbon to be mixed with the metal sulfate are coal, petroleum coke, activated carbon and carbon black. Preferably, carbon with a low content of hydrogen is used. From the standpoint of its price, coal or petroleum coke is preferred. A mixture of carbons may also be used equally.

In the present invention, the metal sulfate is subjected to decomposition reaction as a mixture with carbon. The mixture may be obtained by simply mixing the metal sulfate and carbon having much the same particle diameter in a kneader or the like, or by mixing particulate carbon with the metal sulfate. When the starting ammonium sulfate contains the aforesaid organic impurities, these impurities also act as a reducing agent.

Preferably, the reduction temperature is low, and the decomposition reaction of the ammonium sulfate is fast. When the reduction temperature is more than about 2,000° C., the selection of a material of which a reduction furnace is made is a problem, and will cause economic disadvantage. If it is too low, the decomposition of organic compounds as impurities is suppressed. It is generally desirable to carry out the reduction at a temperature of 650° to 1,800° C., preferably 750° to 1,600° C., more preferably 800° to 1000° C.

The reduction furnace may be, for example, an ordinary furnace of the fluidized bed, fixed bed or moving bed type (such as a rotary kiln). The fluidized bed-type furnace is advantageous in operating efficiency and cost in dealing with a large-scale process.

In carrying out the decomposition reaction of the metal sulfate in a fluidized bed, the mixture of the metal sulfate and carbon may be used in the form of a slurry or granules. For practical purposes, the granules preferably have a particle diameter of about 0.1 to 50 mm. The granules may be in the form of pellets.

In this step, water (including water of crystallization) remaining in the treated product from the previous step is gasified, and the metal sulfate is decomposed into a metal oxide and $SO_2$. From an industrial viewpoint, it is preferred to recover the metal oxide entrained in the discharge gas by using a cyclone, cottrel, etc. in a customary manner, cooling it together with the metal oxide recovered from the bottom of the reduction furnace, mixing the metal oxide with water, and to use the mixture again in the step of decomposing ammonium sulfate.

In the present invention, it is more efficient and preferably to carry out the decomposition step by a method comprising decomposing the metal sulfate while a mixture of it with carbon is being fed into fluidized solid particles, and carrying the resulting metal oxide on a gas current away from the system.

The solid particles used in this method may be any solid particles which have heat resistance and do not scatter easily. Generally, these solid particles preferably have a knoop hardness of at least 600 kg.f/mm$^2$. In particular, solid particles of silica, alumina or a mixture of both are preferably used because they produce particularly good results. Such silica and alumina particles may contain other particles which do not impede the effects of the present invention. For good abrasion resistance, spherical solid particles are preferred. Usually, these solid particles have an average particle diameter of preferably 0.1 to 5 mm, more preferably 0.5 to 1.5 mm, because too large particles are difficult of flowing and too small particles tend to scatter.

Since the decomposition reaction of the metal sulfate in the present invention is an endothermic reaction, it is necessary to heat the reaction system by, for example, burning the carbon in order to maintain a suitable reaction temperature. To maintain a suitable reaction temperature and a suitable reducing atmosphere, it is preferred to supply air so that the mole ratio of oxygen to the reducing agent is generally from 0.6 to 1.05, preferably from 0.7 to 0.9.

Air is blown into the $SO_2$-containing gas recovered to burn the reducing gas and increase the yield of $SO_2$. It may then be used as a material for various reactions. Alternatively, it may be recovered as sulfuric acid by a known technique and sold on the market or again used in the process of producing epsilon-caprolactam or in the process of producing methyl methaxrylate by the acetone cyanohydrin method. Thus, sulfuric acid can be utilized effectively. Particularly, if the process of this invention is carried out in the production of methyl methacrylate by the acetone cyanohydrin method using ammonia and sulfuric acid as materials, the entire process can be carried out completely in a closed system, and the effects of the invention are great.

The process of this invention can be most efficiently performed when the metal sulfate is magnesium sulfate.

The process of this invention will now be described more specifically by referring to FIG. 1 accompanying this application which is a flow sheet showing one embodiment of the process of this invention.

The reference numerals have the following means.

1: first-stage reactor
2: second-stage reactor
3: third-stage reactor
4: line for feeding the metal oxide or hydroxide
5: line for feeding an aqueous solution or slurry of ammonium sulfate
6: cooler
7: pressure reduction system
8: gas-liquid separator
9: aqueous ammonia
10: incoming heat medium
11: outgoing heat medium
12: temperature and pressure elevator
13: temperature and pressure lowering device
14: centrifugal liquid-solid separator
15: mother liquor
16: carbon mixer
17: carbon
18: solidifying device
19: pulverizing and classifying device
20: fluidized reduction furnace
21: air
22: cyclone
23: sulfur dioxide
24: metal oxide The reactors 1, 2 and 3 are for carrying out the reaction of ammonium sulfate with the metal oxide or hydroxide. The metal oxide or hydroxide is fed from the line 4, and an aqueous solution or slurry of ammonium sulfate is fed from the line 5. In the embodiment shown in FIG. 1, three reactors are used, and the third-stage reactor 3 is heated with a heat medium 10 such as steam. As can be clearly seen from Examples to be given hereinbelow, various modes of the reaction can be taken, for example, in regard to the sequence of supplying a heat source. In FIG. 1, the vapor generated from the third-stage reactor 3 is supplied to the second-stage reactor 2 as a heat source, and the vapor generated from the second-stage reactor 2 is supplied to the first-stage reactor 1 as a heat source. When the heat medium used as a heat source in the third-stage reactor is steam, it is discharged as waste water 11, or as required, recovered. When it is an oil, it is re-heated and used as the heat source. The vapor generated from the third-stage reactor, after it is used as the heat source in the second-stage reactor 2, is condensed as aqueous ammonia which is mixed with aqueous ammonia resulting from condensation of the vapor used as the heat source in the first stage reactor 1. The mixture is then recovered as ammonia from 9 in a customary manner. The vapor generated from the first-stage reactor 1 is condensed under reduced pressure via the cooler 6, and mixed with the aforesaid aqueous ammonia. 8 is a gas-liquid separator. The reactors used may usually be reactors equipped with a jacket and a stirrer. The reaction mixture obtained from the third-stage reactor 3 consists mainly or magnesium sulfate and water when magnesium oxide or magnesium hydroxide is used as the metal oxide or hydroxide. It is converted mainly into magnesium sulfate monohydrate in the temperature and pressure elevator 12, the temperature and pressure lowering device 13 and the centrifugal liquid-solid separator 14. The mother liquor 15 obtained from the centrifugal liquid-solid separator 14 is recycled to the first-stage reactor 1. If desired, the mother liquor may be further treated and discarded. However, to increase the recovery ratio of ammonia, the mother liquor is desirably recycled to step (i). Thereafter, the metal sulfate is mixed with carbon 17 by the carbon mixer 16, and introduced into the reduction furnace 20 having a fluidized bed, etc. via the solidifying device 18 effecting solidification by cooling or drying and the pulverizing and classifying device 19. The metal sulfate mixed with carbon in the carbon mixer 16 may be directly introduced into the reduction furnace 20 without going through the solidifying device 18 and the pulverizing and classifying device 19. Air 21 is fed from the lower part of the reduction furnace, and the metal sulfate is reduced. By the cyclone 22, the metal oxide (such as MgO) is collected from the gas current from the reduction furnace. The metal oxide (such as MgO) is collected mainly from 24 and $SO_2$ is recovered from 23. As required, the metal oxide, etc. may be withdrawn from the bottom of the reduction furnace.

The following examples illustrate the present invention more specifically. It should be understood however that the scope of the invention is not limited by these examples.

EXAMPLE 1

A 1-liter four-necked flask equipped with a stirrer and a reflux condenser was charged with 40 g of MgO and 250 g of water, and the mixture was stirred at 80° C. for 60 minutes. Thereafter, 110 g of ammonium sulfate powder (extra pure reagent made by Wako Pure Chemicals Industries, Ltd.) was added from the top of the flask, and reacted at 80° C. for 60 minutes. After the reaction, the reaction mixture was cooled, and filtered under pressure to separate the unreacted MgO and $Mg(OH)_2$. The mother liquor was distilled to give $NH_3$ in a yield of 97%.

The $MgSO_4$ solution after removal of $NH_3$ was concentrated, cooled and subjected to solid-liquid separation to recover 200 g of $MgSO_4.7H_2O$. It was dried by a hot air dryer at 100° C. to give 115 g of a powder. The powder was charged into a quartz column having an inside diameter of 40 mm. Hydrogen was passed through it at a rate of 150 Nml/sec., and reduction was performed at 800° C. for 30 minutes. The resulting powder (33 g) was analyzed and was found to contain 98% MgO. This MgO could be reused in the step of reacting ammonium sulfate with the metal oxide or hydroxide.

$NH_3$ recovered was reacted with methane to form hydrogen cyanide, and further reacted with acetone to form acetone cyanohydrin. $SO_2$ was recovered as sulfuric acid. These compounds could be fully used in the production of methyl methacrylate by the acetone cyanohydrin method.

EXAMPLE 2

Example 1 was repeated except that the reaction of the MgO slurry with ammonium sulfate was carried out at 102° C. using a reactor having a distillation column at its upper part. As aqueous ammonia, 97% of ammonia could be recovered from the top of the distillation column. The recovered MgO could be reused. As in Example 1, $NH_3$ and $SO_2$ could be fully reused.

EXAMPLE 3

Example 1 was repeated except that CO was used as the reducing agent. Almost the same results as in Example 1 were obtained.

EXAMPLES 4–8

Example 1 was repeated except that a mixture of 60 g of ammonium sulfate and 37 g of sulfuric acid (Example 4), a mixture of 60 g of ammonium sulfate, 37 g of sulfuric acid and 50 g of water (Example 5), a mixture of 60 g of ammonium sulfate, 37 g of sulfuric acid, 50 g of water and 5 g of p-toluenesulfonic anhydride (extra pure reagent, Wako Pure Chemicals Industries, Ltd.) (Example 6), a mixture of 60 g of ammonium sulfate, 37 g of sulfuric acid, 50 g of water and 6.33 g of acetonedisulfonic acid (extra pure reagent, Wako Pure Chemicals Industries, Ltd.) (Example 7) and a mixture of 60 g of ammonium sulfate, 37 g of sulfuric acid, 50 g of water and 3.29 g of epsilon-caprolactam (extra pure reagent, Wako Pure Chemicals Industries, Ltd.) (Example 8) were each used instead of the ammonium sulfate in Example 1. The ratio of $NH_3$ recovery was 96%, 98%, 96%, 96% and 96%, respectively, and the ratio of $SO_2$ recovery was 98%, 102%, 102%, and 102%, respectively. Other results were almost the same as in Example 1.

EXAMPLE 9

Six grams of a commercial carbon (activated carbon, coke, petrocoke, graphite or carbon black) was used as the reducing agent in Example 1, and mixed with 115 g of the dry powder obtained in the first step. The mixture of nitrogen at a flow rate of 150 Nml/min. The resulting powder (33.7 g) was analyzed, and the formation of 96% of MgO could be determined. The MgO with residual carbon was again used. The steps could be performed without any trouble. The residual carbon could be separated together with MgO and Mg(OH)$_2$ at the time of filtration under pressure. Twenty grams of sulfuric acid was added to the separated solid, and the mixture was stirred for 20 minutes and subjected to solid-liquid separation. The liquid was recycled to the first step. The solid could be reused as the reducing agent after drying.

EXAMPLE 10

A mixture of 30 g of MgO and 17.7 g of MnO$_2$ was used instead of 40 g of MgO in Example 1. Otherwise, the same treatment as in Example 1 was carried out, and the reduction was carried out at 750° C. for 30 minutes in a hydrogen stream at a flow rate of 150 Nml/sec. There was recovered 46.3 g of a mixture of MgO and MnO$_2$. Other results were the same as in Example 1.

EXAMPLE 11

A 1-liter four-necked flask equipped with a stirrer and a reflux condenser was charged with 56 g of CaO and 275 g of water, and the mixture was stirred at 80° C. for 60 minutes. Then, 110 g of ammonium sulfate powder was added from the upper part of the flask, and reacted at 80° C. for 60 minutes. After the reaction, the reaction mixture was cooled, and filtered under pressure to separate it into a mixture of CaO, Ca(OH)$_2$ and CaSO$_4$ and the mother liquor. The mother liquor was distilled to drive off NH$_3$ and 80% of NH$_3$ was reused. The remainder (20%) was evaporated to dryness and used as a reducing agent. The ratio of NH$_3$ recovery was 98%. The separated solid product was dried by a hot air dryer at 100° C. to give 155 g of a powder. The powder was mixed well with 6 g of carbon, charged into an alumina tube having inside diameter of 40 mm, and reduced at 1100° C. for 30 minutes in a stream of nitrogen at a flow rate of 150 Nml/min. The yield of the reduction product as a sulfur compound was 95%. When CaO obtained by reduction was recycled to the process, all the steps could be carried out without a trouble.

EXAMPLE 12

In a 1-liter powder mixer, 40 g of MgO, 110 g of ammonium sulfate powder and 60 g of water were mixed at 100° C. for 90 minutes. Nitrogen was passed from the lower part of the powder mixer at a rate of 50 Nml/minute. Ammonia recovered from the upper part of the powder mixer was recovered by a cooler. The ratio of recovery of ammonia at this time was 90%. The powder was dried at 150° C. for 30 minutes in the powder mixer, then introduced into a quartz tube having an inside diameter of 40 mm, and reduced at 800° C. for 30 minutes in a stream of hydrogen at a flow rate of 150 Nml/sec. 98% of the resulting powder (33 g) was MgO. The off-gas contained 8% of NH$_3$ gas.

EXAMPLE 13

A 1-liter glass four-necked flask equipped with a stirrer and a reflux condenser was charged with 154 g of BaO (extra pure reagent, Wako Pure Chemicals Industries, Ltd.) and 250 g of water, and the mixture was stirred at 80° C. for 60 minutes. Thereafter, 110 g of ammonium sulfate powder was added from the upper part of the flask, and reacted at 80° C. for 60 minutes. After the reaction, the reaction mixture was cooled and filtered under pressure to separate it into a mixture of BaO, Ba(OH)$_2$, and BaSO$_4$, and the mother liquor. The mother liquor was distilled to drive off NH$_3$. The ratio of recovery of NH$_3$ was 97%. The separated solid was dried in a hot air dryer at 100° C. to give 220 g of a powder. The powder was well mixed with 6 g of carbon, introduced into an alumina tube having an inside diameter of 50 mm, and reduced at 1,600° C. for 30 minutes in a nitrogen stream at a flow rate of 150 Nml/min. The yield of the product as a sulfur compound was 80%. When BaO obtained by the reduction was recycled to the process and again used, the individual steps could be performed without a trouble. The recovered NH$_3$ did not poison an ammoxidation catalyst for methane and cyclohexane.

EXAMPLE 14

Example 10 was repeated except that 26 g of CuO was used instead of 17.7 g of MnO$_2$. When the reduction was carried out at 820° C. for 30 minutes in a stream of hydrogen at a flow rate of 150 Nml/sec., 55.4 g of a mixture of MgO and CuO could be recovered. Other results were the same as in Example 10.

EXAMPLE 15

Example 10 was repeated except that 22 g of NiO was used instead of 17.7 g of MnO$_2$. When the reduction was carried out at 800° C. for 30 minutes in a stream of hydrogen at a flow rate of 100 Nml/sec., 51.4 g of a mixture of MgO and NiO could be recovered. The results were the same as in Example 10.

EXAMPLE 16

Example 10 was repeated except that 12.2 g of ZnO was used instead of 17.7 g of MnO. When the reduction was carried out at 800° C. for 30 minutes in a stream of a mixture of CO (50 Nml/sec.) and nitrogen (100 Nml/min.), 41 g of a mixture of MgO and ZnO could be recovered. Other results were the same as in Example 10.

COMPARATIVE EXAMPLE 1

ZnO (40.68 g), 55 g of ammonium sulfate powder and 6 g of activated powder were mixed, introduced into a quartz tube having an inside diameter of 40 mm, and heated to 410° C. During the reaction, nitrogen was passed at a flow rate of 150 Nml/min. for 20 minutes. The discharged gas was cooled and condensed and caused to be absorbed by water. The NH$_3$ recovery ratio from the recovered water was 95%. When the recovered ammonia was again used in the process, the catalyst for ammoxidation of methane and cyclohexane was poisoned.

COMPARATIVE EXAMPLE 2

Comparative Example 1 was repeated except that 3 g of acetonedisulfonic acid was further added as a raw material. The recovered aqueous ammonia contained acetone and SO$_2$. When the recovered aqueous ammonia was again used, the activity of the ammoxidation reaction catalyst was reduced.

EXAMPLE 17

Three 10-liter stainless steel reactors equipped with a stirrer and a jacket were connected to each other in series. MgO preheated to 80° C. and a 35.5% by weight aqueous solution of ammonium sulfate were fed by a screw feeder and a supply pump to a first-stage reactor at a flow rate of 1.5 kg/hr and 13.3 kg/hr, respectively. Steam under 4 kg/cm$^2$-G was fed to the jacket of a second-stage reactor at a rate of 2.1 kg/hr. The vapor generated from the second-stage reactor was fed to the jacket of the first-stage reactor, and the vapor generated from the first-stage reactor was supplied to the jacket of a third-stage reactor. The temperatures in the reactors were set at 80°, 100°, 60° C., and the residence time in each reactor was maintained at 20 minutes. The third-stage reactor and its jacket were maintained under reduced pressure, and the vapor was cooled and condensed and mixed with aqueous ammonia condensed through the jacket of the first-stage reactor to recover aqueous ammonia. The concentration of ammonia was 17.4% by weight, and the aqueous ammonia was further purified by a customary method. From the third-stage reactor, MgSO$_4$, H$_2$O, ammonium sulfate and MgO were obtained at a rate of 4.3 kg/hr, 3.34 kg/hr, 0.05 kg/hr and 0.09 kg/hr, respectively. When the mother liquor obtained by solid-liquid separation was recycled to the first-stage reactor and the reaction was carried out, the ratio of ammonia recovery was more than 99 mole %, and the amount of steam consumed was 0.525 kg/kg-MgSO$_4$. When the recovered ammonia was used in the ammoxidation reaction of methane, no problem such as catalyst poisoning arose. When the reaction was carried out without recycling the mother liquor, the ratio of ammonia recovery was 94 mole %. When the recovered ammonia was used in the ammoxidation of methane, no problem such as catalyst poisoning arose. From the third-stage reactor, MgSO$_4$, H$_2$O, ammonium sulfate and MgO were obtained at a rate of 4.0 kg/hour, 3.9 kg/hour, 0.28 kg/hour and 0.16 kg/hour, respectively. The amount of steam consumed was 0.525 kg/kg-MgSO$_4$.

EXAMPLE 18

One reactor of the type used in Example 17 was used, and MgO pre-heated to 80° C. and a 35.3% by weight aqueous solution of ammonium sulfate were fed at a rate of 0.75 kg/hour and 6.65 kg/hour. Steam under 4 kg/cm$^2$-G was supplied to the jacket of the reactor at a rate of 3.15 kg/hour. The reactor was maintained under 500 torr, and the vapor was cooled and condensed. The average residence time in the reactor was set at 60 minutes. The reaction mixture obtained by the reaction was subjected to solid-liquid separation. When the mother liquor was recycled to the reactor and the reaction was carried out, the ratio of ammonia recovery was 97 mole %, and the concentration of ammonia was 16.2% by weight. The amount of steam consumed was 1.575 kg/kg-MgSO$_4$. When the reaction was carried out without recycling the mother liquor, the ratio of ammonia recovery was 85 mole %.

EXAMPLE 19

In Example 17, steam was supplied to the jacket of the second-stage reactor and maintained at 100° C. The vapor generated from the second-stage reactor was used as a heat source for the third-stage reactor. The vapor generated from the third-stage reactor set at a reaction temperature of 60° C. was used as a heat source for the first-stage reactor. The first-stage reactor was operated at 40° C. The ratio of ammonia recovery was 98 mole %, and the concentration of ammonia was 16.6% by weight. When the reaction was carried out without recycling the mother liquor, the ratio of ammonia recovery was 87 mole %.

EXAMPLE 20

In Example 17, steam was fed to the jacket of the third-stage reactor. The vapor generated from the third-stage reactor was fed to the jacket of the second-stage reactor. The vapor generated from the second-stage reactor was used as a heat source for the first-stage reactor. The process was operated while maintaining the first-stage, second-stage and third-stage reactors at 110°, 130° and 150° C. The ratio of ammonia recovery was 90 mole % and the concentration of ammonia was 15% by weight. When the reaction was carried out without recycling the mother liquor, the ratio of ammonia recovery was 78 mole %.

EXAMPLE 21

A 1-liter glass reactor equipped with a stirrer, a thermometer and a heater and having a port for liquid withdrawal and a port for gas discharge was charged with 500 g of magnesium sulfate heptahydrate and 20 g of water. With stirring, the temperature was raised to 140° C. After temperature elevation, the temperature was maintained for 60 minutes. The mixture was filtered through a pressure-resistant filter under an inside pressure of 2 kg/cm$^2$-G and a differential pressure of 1 kg/cm$^2$. It was further filtered under a nitrogen pressure (differential pressure 1 kg/cm$^2$), and the pressure was lowered to atmospheric pressure. There was obtained 195 g of a solid product. The solid product contained 18% by weight of water, and 65.5% of magnesium sulfate could be recovered.

EXAMPLE 22

As in Example 21, the temperature was raised to 140° C., and this temperature was maintained for 60 minutes. Then, the pressure was lowered to atmospheric pressure over the course of 5 minutes, and immediately then, the mixture was filtered through a filter under reduced pressure. There was obtained 210 g of a solid product containing 27% by weight of water. Furthermore, 63% of magnesium sulfate could be recovered.

EXAMPLE 23

Example 21 was repeated except that the temperature maintained was changed to 170° C. There was obtained 250 g of a solid product containing 18% by weight of water. Furthermore, 84% of magnesium sulfate could be recovered.

EXAMPLE 24

Example 21 was repeated except that the temperature maintained was changed to 120° C. There was obtained 165 g of a solid product containing 22% by weight of water. Furthermore, 53% of magnesium sulfate could be recovered.

EXAMPLE 25

Example 21 was repeated except that the temperature maintained was changed to 170° C., and after temperature elevation, the pressure was immediately lowered. There was obtained 154 g of a solid product containing 21% by weight of water. Furthermore, 50% of magnesium sulfate could be recovered.

EXAMPLE 26

Example 21 was repeated except that the temperature maintained was changed to 90° C., and solid-liquid separation was carried out at 85° C. There was obtained 61 g of a solid product containing 42% by weight of water. Furthermore, 20% of magnesium sulfate could be recovered.

EXAMPLE 27

Example 21 was repeated except that the temperature maintained after temperature elevation was changed to 220° C. There was obtained 183 g of a solid product containing 20% by weight of water. Some magnesium sulfate tended to adhere to the heated surface.

EXAMPLE 28

Example 17 was repeated except that the temperatures in the first-stage, second-stage and third-stage reactors were set at 80°, 100° and 120° C.; steam under 4 kg/cm$^2$-G was supplied to the jacket of the third-stage reactor at a rate of 2.1 kg/hour; the vapor generated from the third-stage reactor was supplied to the jacket of the second-stage reactor; and the vapor generated from the second-stage reactor was supplied to the jacket of the first-stage reactor.

From the third-stage reactor, MgSO$_4$, H$_2$O, ammonium sulfate and MgO were obtained at a rate of 4.3 kg/hr, 3.34 kg/hr, 0.05 kg/hr and 0.09 kg/hr, respectively.

Then, 140 kg of the liquid of the above composition obtained from the third-stage reactor was charged into a temperature and pressure elevating machine consisting of a 200 liter stainless steel tank equipped with a stirrer and a heater, heated to 140° C. and maintained at this temperature for 60 minutes. Then, quickly, the liquid was lowered in pressure in a pressure lowering machine composed of another tank. It was subjected to a centrifugal liquid-solid separator (Model HS-204 LS, made by Ishikawajima Harima Heavy Industries Co., Ltd.) at a temperature of 105° C., an acceleration speed of 3,000 G and a feed rate of 300 liters/hour to separate magnesium sulfate monohydrate. The recovered magnesium sulfate contained 20% by weight of water, and 70% of magnesium sulfate could be recovered.

The ratio of ammonia recovery was 99 mole %, and the concentration of ammonia was 17.4% by weight. When the recovered ammonia was used in the ammoxidation reaction of methane, no particular problem arose.

When the reaction was carried out without recycling the mother liquor, the ratio of ammonia recovery was 92 mole %.

The slurry of magnesium sulfate monohydrate was mixed with petrocoke in a mole ratio to magnesium sulfate monohydrate of 1.4 by using a carbon mixer (a double arm kneader S5-3 type made by Moriyama Mfg. Works, Ltd.). The mixture was fed to a stainless steel solidifying machine (of the type in which cooling water was passed through a rotating drum having a diameter of 500 mm and an inner capacity of 500 liters and the slurry of magnesium sulfate added dropwise on the surface of the drum is scraped by a scraper) by means of a screw feeder equipped with a hopper, and cooled and solidified. The solidified product was pulverized by a hammer mill (Hammer mill H-12 type made by Hosokawa Micron Corporation) to obtain black magnesium sulfate having an average particle diameter of 0.75 mm.

Alumina particles having an average particle diameter of 0.7 mm (0.8 liter) was introduced into a stainless steel fluidized bed fully kept at an elevated temperature and having an inside diameter of 100 mm, and fully heated with a combustion gas of LPG. When the inside temperature reached 950° C., the supply of LPG was stopped. The above black magnesium sulfate was fed to the fluidized bed at a rate of 1.57 kg/hour. At the same time, air was supplied from the lower part of the fluidized bed at 1160 Nml/hour (the rate 0.83 times the amount required for burning carbon). About 3 hours later when the reaction was stabilized, a cyclone was set up at the exit of the fluidized bed and scattering MgO was collected. The magnesium collected was 99% by weight of the magnesium fed. The collected MgO had a purity of 95 mole %.

The ratio of SO$_2$ recovery from the gas current flowing from the cyclone was 94%. This SO$_2$ was recovered as H$_2$SO$_4$ in a customary manner. The recovered ammonia and sulfuric acid could be fully used as in Example 1. MgO could be fully reused in the reaction of ammonium sulfate in accordance with this invention.

According to this invention, NH$_3$ and SO$_2$ of good purity can be efficiently produced from ammonium sulfate. Since they can be reused as starting materials, the process of this invention is useful not only as a measure of pollution control, but also in industries yielding large quantities of ammonium sulfate, for example in the production of methyl methacrylate by the acetone cyanohydrin method or by the ethylene cyanohydrin method, and in the production of epsilon-caprolactam.

We claim:

1. A process for producing NH$_3$ and SO$_2$ from ammonium sulfate, which comprises
    (i) reacting ammonium sulfate with magnesium oxide or hydroxide at a temperature of not more than 200° C. to form NH$_3$, water and magnesium sulfate heptahydrate or an aqueous solution or slurry containing magnesium sulfate in a concentration of at least 15% by weight; recovering NH$_3$;
    (ii) heating the magnesium sulfate heptahydrate or the aqueous solution or slurry containing magnesium sulfate in a concentration of at least 15% by weight to 100° to 200° C. in a closed system and maintaining it at this temperature for at least 60 minutes; and separating and recovering the resulting solid product from the resulting liquid,
    (iii) decomposing the solid product in the presence of a reducing agent to form magnesium oxide and SO$_2$ and recovering SO$_2$, and
    (iv) recycling the magnesium oxide to step (i) as such or after it converted to magnesium hydroxide.

2. The process of claim 1 in which the magnesium oxide or hydroxide is composed of an oxide or hydroxide of Mg and not more than 50 mole %, based on said oxide or hydroxide, of an oxide or hydroxide of another metal selected from the group consisting of Mn, Cu, Ni and Zn.

3. The process according to claim 1 wherein said heating in a closed system is performed at 120° to 170° C.

4. The process according to claim 3 wherein, after maintaining the temperature of 120° to 170° C. for at least 60 minutes, the pressure is then immediately lowered to atmospheric pressure and the resulting solid product is separated and recovered.

5. The process of claim 1 in which the reaction of ammonium sulfate with the magnesium oxide or hydroxide is carried out in at least two successively aligned reactors, and the reaction in a first-stage reactor is carried out at a temperature of 60° to 100° C.

6. The process of claim 1 in which the reaction of ammonium sulfate with the magnesium oxide or hydroxide is carried out in at least two successively aligned reactors, heat is given to a reactor desired to be set at the highest reaction temperature, the vapor generated from this reactor is supplied as a heat source to a reactor to be set at the next highest reaction temperature, and the vapor generated in this reactor is supplied as a heat source to a reactor to be set at the third highest reaction temperature, and the reaction is carried out while supplying the vapor from one reactor to another in this manner.

7. The process of claim 1 in which in the reaction of ammonium sulfate with the magnesium oxide or hydroxide carried out continuously, the conversion of ammonium sulfate is maintained at 60 to 85 mole %.

8. The process of claim 1 in which the metal sulfate and the unreacted magnesium oxide or hydroxide are separated and recovered from the reaction product obtained by the reaction of ammonium sulfate with the magnesium oxide or hydroxide, and the remaining mother liquor is recycled to step (i).

9. The process of claim 1 in which the decomposition reaction of the magnesium sulfate is carried out while a mixture of the magnesium sulfate and carbon is fed into fluidized solid particles, and the resulting magnesium oxide is carried on a gas current away from the reaction system.

10. The process of claim 9 in which the solid particles are particles of silica, alumina or a mixture of both.

* * * * *